United States Patent
Hong

(10) Patent No.: US 10,384,229 B2
(45) Date of Patent: Aug. 20, 2019

(54) APPARATUS AND METHOD FOR DISPENSING ADHESIVE LIQUID FOR DUST TRAP

(71) Applicant: PROTEC CO., LTD., Gyeonggi-do (KR)

(72) Inventor: Seung Min Hong, Incheon (KR)

(73) Assignee: PROTEC CO., LTD., Gyeonggi-do (KR)

( * ) Notice: Subject to any disclaimer, the term of this patent is extended or adjusted under 35 U.S.C. 154(b) by 14 days.

(21) Appl. No.: 15/429,168

(22) Filed: Feb. 10, 2017

(65) Prior Publication Data

US 2018/0021805 A1    Jan. 25, 2018

(30) Foreign Application Priority Data

Jul. 19, 2016    (KR) .................. 10-2016-0091401

(51) Int. Cl.
| | |
|---|---|
| *B05C 5/02* | (2006.01) |
| *B08B 1/00* | (2006.01) |
| *B08B 17/00* | (2006.01) |
| *B05D 1/18* | (2006.01) |
| *B08B 3/08* | (2006.01) |
| *B05C 9/08* | (2006.01) |
| *B05D 1/26* | (2006.01) |

(52) U.S. Cl.
CPC .................. *B05D 1/18* (2013.01); *B05C 5/02* (2013.01); *B05C 9/08* (2013.01); *B08B 1/006* (2013.01); *B08B 3/08* (2013.01); *B08B 17/00* (2013.01); *B05D 1/26* (2013.01); *B08B 2220/01* (2013.01)

(58) Field of Classification Search
None
See application file for complete search history.

(56) References Cited

U.S. PATENT DOCUMENTS

| | | | | |
|---|---|---|---|---|
| 2008/0264252 | A1* | 10/2008 | Ichihara .................. | B01D 53/10 95/94 |
| 2010/0019134 | A1* | 1/2010 | Tsukamoto .......... | H04N 5/2251 250/216 |
| 2011/0074870 | A1* | 3/2011 | Maida ....................... | B08B 3/02 347/28 |

FOREIGN PATENT DOCUMENTS

| | | | | |
|---|---|---|---|---|
| JP | 57101620 A | * | 6/1982 | ............... C21D 9/56 |
| KR | 10-20150067663 | * | 6/2015 | ......... B05B 15/0208 |

* cited by examiner

*Primary Examiner* — Xiao S Zhao
(74) *Attorney, Agent, or Firm* — JCIPRNET

(57) ABSTRACT

Provided are apparatus and method of dispensing an adhesive liquid for a dust trap, in which the adhesive liquid is dispensed to a camera module while effectively cleaning the adhesive liquid that may be smeared on a nozzle, thereby enhancing productivity and quality of a process of forming a dust trap.

4 Claims, 4 Drawing Sheets

APPARATUS AND METHOD FOR DISPENSING ADHESIVE LIQUID FOR DUST TRAP

CROSS-REFERENCE TO RELATED APPLICATION

This application claims the benefit of Korean Patent Application No. 10-2016-0091401, filed on Jul. 19, 2016, in the Korean Intellectual Property Office, the disclosure of which is incorporated herein in its entirety by reference.

BACKGROUND

1. Field

One or more exemplary embodiments relate to an apparatus and method for dispensing an adhesive liquid for a dust trap, and more particularly, to an apparatus and method for dispensing an adhesive liquid for a dust trap, to a camera module in a manufacturing process of the camera module.

2. Description of the Related Art

A camera module mounted in a mobile device such as a mobile phone is completed by installing a voice coil motor (VCM) lens module on an image sensor.

As high-image quality camera modules have recently been developed, camera modules are frequently manufactured by mounting a VCM lens module on an image sensor after attaching an infrared (IR) filter and a blue filter on the image sensor.

However, if other processes are performed on an image sensor of a camera module before mounting a VCM lens module on the image sensor and contaminants such as dust are attached to the image sensor, the camera module becomes defective.

In order to prevent dust contamination of an image sensor of a camera module, a process of a dust trap as described above is used.

When a dust trap is formed by dispensing an adhesive liquid around an image sensor of a camera module, foreign substances such as dust are principally attached to the adhesive liquid. In this manner, contamination of the image sensor may be prevented or the possibility of contamination may be reduced. According to circumstances, an adhesive mixed with a static electricity-generating material may be dispensed to thereby enhance the effect of attracting dust to the dust trap.

In a process of dispensing an adhesive liquid around an image sensor to form a dust trap as described above, it is essential to dispense an accurate amount of the adhesive liquid to an accurate location. The adhesive liquid used here typically has a low viscosity and a fast hardening speed. When dispensing an adhesive liquid having the above-described characteristics, the adhesive liquid may be smeared on a lower surface or a lateral surface of a nozzle and hardened during an adhesive liquid dispensing process. If the adhesive liquid is smeared on the nozzle to be hardened, the quality of the adhesive liquid dispensing process is degraded. In order to prevent the above problem, an apparatus and method for effectively cleaning and wiping the adhesive liquid smeared on the nozzle are required.

SUMMARY

One or more exemplary embodiments include an apparatus for dispensing an adhesive liquid around an image sensor of a camera module to form a dust trap while effectively cleaning a nozzle, and a method of dispensing an adhesive liquid for a dust trap, in which the adhesive liquid is dispensed using the apparatus.

Additional aspects will be set forth in part in the description which follows and, in part, will be apparent from the description, or may be learned by practice of the presented embodiments.

According to one or more exemplary embodiments, an apparatus for dispensing an adhesive liquid for a dust trap, to a portion around an image sensor of a camera module, to prevent dust contamination of the image sensor during a manufacturing process of the camera module, includes: an adhesive liquid pump configured to dispense the adhesive liquid to the camera module through a nozzle; a pump transporting unit configured to transport the adhesive liquid pump to the camera module; and a cleaning unit configured to generate a flow of a cleaning liquid with respect to the nozzle of the adhesive liquid pump transported using the pump transporting unit so as to clean the nozzle by using the cleaning liquid that dissolves the adhesive liquid.

According to one or more exemplary embodiments, a method of dispensing an adhesive liquid for a dust trap, to a portion around an image sensor of a camera module, to prevent dust contamination of the image sensor during a manufacturing process of the camera module, includes: (a) transporting an adhesive liquid pump by using a pump transporting unit so as to dispense the adhesive liquid to the camera module through a nozzle of the adhesive liquid pump; and (b) transporting the adhesive liquid pump by using the pump transporting unit, to a cleaning unit that allows a cleaning liquid to flow so as to clean the nozzle of the adhesive liquid pump.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The present invention will now be described more fully with reference to the accompanying drawings.

Figure 1:
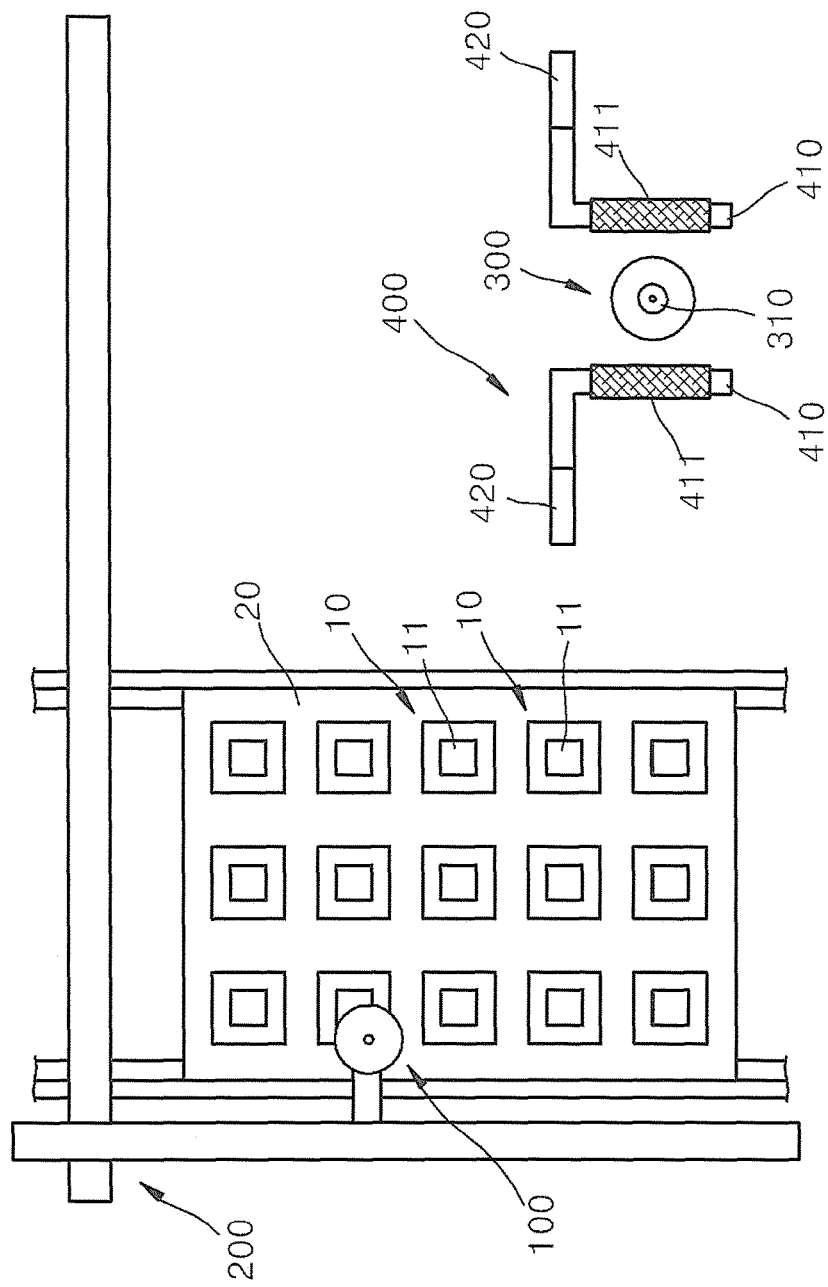
FIG. 1 is a plan view of an apparatus for dispensing an adhesive liquid for a dust trap according to an exemplary embodiment of the present invention.
Figure 2:
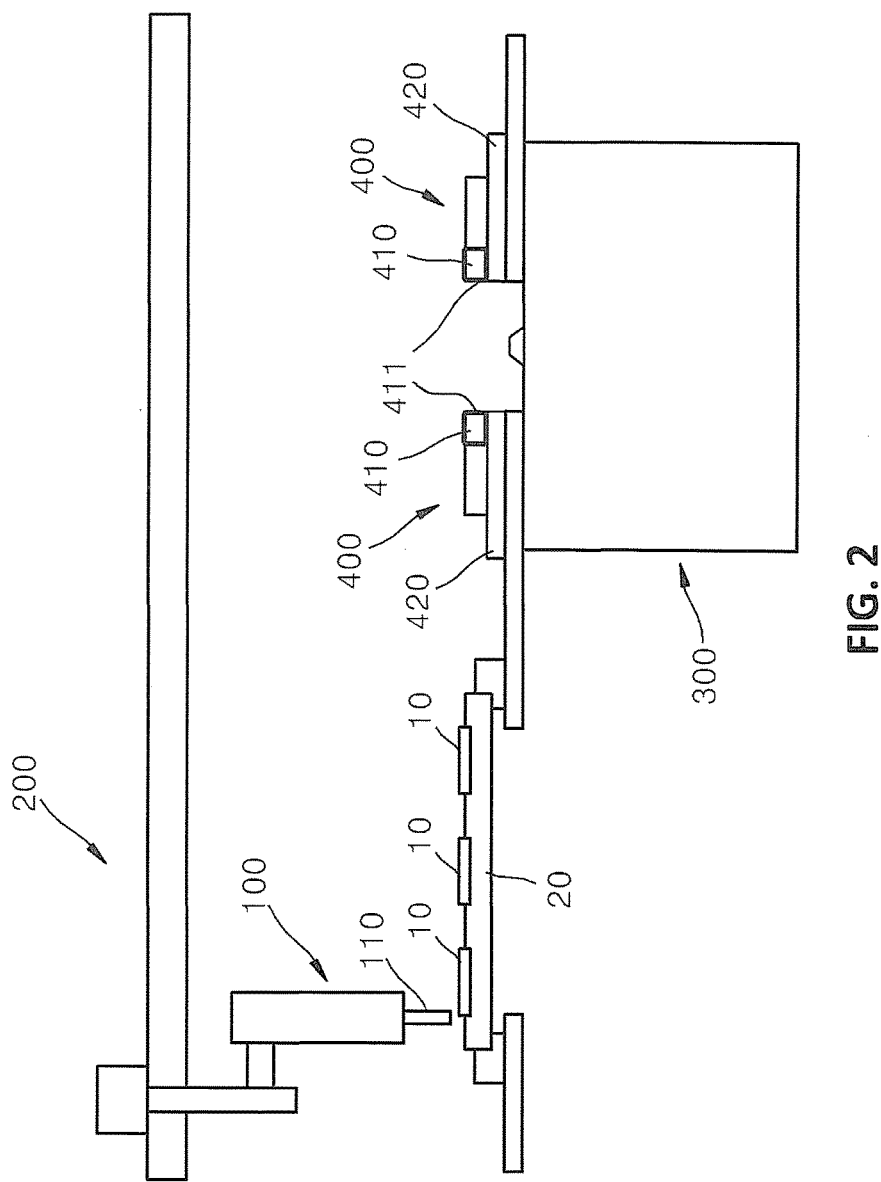
FIG. 2 is a front view of the apparatus for dispensing an adhesive liquid for a dust trap illustrated in FIG. 1.

FIG. 1 is a plan view of an apparatus for dispensing an adhesive liquid for a dust trap according to an exemplary embodiment of the present invention. FIG. 2 is a front view of the apparatus for dispensing an adhesive liquid for a dust trap illustrated in FIG. 1.

Referring to FIGS. 1 and 2, the apparatus for dispensing an adhesive liquid for a dust trap according to the present exemplary embodiment may include an adhesive liquid pump 100, a pump transporting unit 200, a cleaning unit 300, and a wiping unit 400.

The adhesive liquid pump 100 includes a nozzle 110. The adhesive liquid pump 100 dispenses an adhesive liquid through the nozzle 110. The adhesive liquid that is dispensed onto a portion around an image sensor 11 of a camera module 10 by using the adhesive liquid pump 100 attracts dust of the surroundings through static electricity or the like to retain the dust. In the present exemplary embodiment, after a blue filter and an infrared (IR) filter are attached to the image sensor 11 of the camera module 10, the adhesive liquid is dispensed around the image sensor 11 by using the adhesive liquid pump 100. Pumps having various well-known structures may be used as the adhesive liquid pump 100 dispensing the adhesive liquid.

When dust contamination is prevented by using the dispensed adhesive liquid, a voice coil motor (VCM) module is mounted on an upper surface of the image sensor 11 to thereby complete the camera module 10.

The pump transporting unit 200 is configured to transport the adhesive liquid pump 100. The pump transporting unit 200 according to the present exemplary embodiment transports the adhesive liquid pump 100 in horizontal and vertical directions. A plurality of camera modules 10 placed on a tray 20 are arranged below the adhesive liquid pump 100. The pump transporting unit 200 transports the adhesive liquid pump 100 sequentially with respect to the plurality of camera modules 10 such that the adhesive liquid is sequentially dispensed to each of the camera modules 10. The pump transporting unit 200 may have various configurations according to necessity based on a well-known structure such as a linear motor.

The cleaning unit 300 is used to clean the nozzle 110 of the adhesive liquid pump 100. During a manufacturing process, the nozzle 110 of the adhesive liquid pump 100 may be contaminated by an adhesive liquid smeared on an outer surface of the nozzle 110 to be hardened or dust smeared on the outer surface of the nozzle 110. In order to provide against contamination of the nozzle 110 of the adhesive liquid pump 100, the nozzle 110 is cleaned using the cleaning unit 300. The cleaning unit 300 cleans the nozzle 110 by using a cleaning liquid L that dissolves the adhesive liquid. When the cleaning unit 300 generates a flow of the cleaning liquid L, the pump transporting unit 200 transports the adhesive liquid pump 100 so that the nozzle 110 is immersed in the flowing cleaning liquid L, thereby cleaning the nozzle 110. After a dispensing operation is performed at preset time intervals or a preset number of times, the pump transporting unit 200 may transport the adhesive liquid pump 100 to the cleaning unit 300 to clean the nozzle 110.

Figure 3:
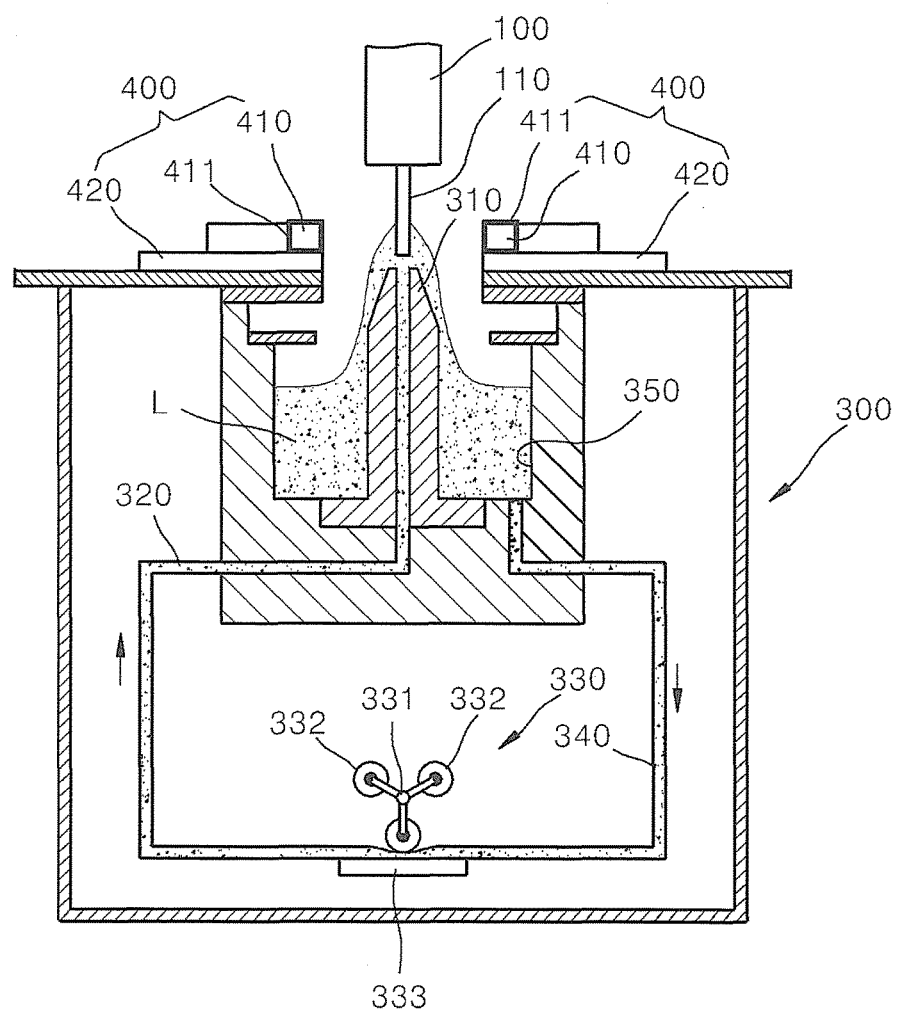
FIG. 3 is a partial cross-sectional view of the apparatus for dispensing an adhesive liquid for a dust trap illustrated in FIG. 1.

Referring to FIG. 3, the cleaning unit 300 of the apparatus for dispensing an adhesive liquid for a dust trap, according to the present exemplary embodiment may include a spouting unit 310, a cleaning liquid pump 330, a supply pipe 320, a collecting unit 350, and a circulation pipe 340.

The spouting unit 310 is configured such that the cleaning liquid L supplied from the outside is spouted through and flows in the spouting unit 310. The nozzle 110 is cleaned while it is disposed to be immersed in the cleaning liquid L flowing in the spouting unit 310. In the present exemplary embodiment, the spouting unit 310 is configured to spout the cleaning liquid L upwards. The cleaning liquid pump 330 and the spouting unit 310 are connected to each other via the supply pipe 320. The cleaning liquid pump 330 supplies the cleaning liquid L into the spouting unit 310 through the supply pipe 320.

As illustrated in FIG. 3, the collecting unit 350 is in a container form surrounding an outer portion of the spouting unit 310. The cleaning liquid L that is spouted from the spouting unit 310 and has cleaned the nozzle 110 flows downwards to be in the collecting unit 350. The circulation pipe 340 connects the collecting unit 350 and the supply pipe 320. The cleaning liquid L stored in the collecting unit 350 is transferred to the supply pipe 320 through the circulation pipe 340. According to this structure, the cleaning liquid L circulates through the supply pipe 320 and the circulation pipe 340. That is, the cleaning liquid L supplied to the spouting unit 310 through the supply pipe 320 flows to the collecting unit 350 and is transferred back to the supply pipe 320 through the circulation pipe 340, thereby circulating via the cleaning liquid pump 330.

Various types of pumps may be used as the cleaning liquid pump 330 for circulating the cleaning liquid L. The apparatus for dispensing an adhesive liquid for a dust trap according to the present exemplary embodiment includes the cleaning liquid pump 330 having a structure as illustrated in FIG. 3.

The cleaning liquid pump 330 used in the apparatus for dispensing an adhesive liquid for a dust trap of the present exemplary embodiment includes a supply support 333, a supply rotational axis 331, and a plurality of rollers 332.

As illustrated in FIG. 3, the supply support 333 is mounted on a portion of the supply pipe 320 to support the supply pipe 320. The supply rotational axis 331 is spaced apart from the supply support 333 and is rotatably mounted. Three rollers 332 are arranged at the same radius from the supply rotational axis 331 and at the same angle along a circumferential direction. As the supply rotational axis 331 rotates, the three rollers 332 roll while sequentially pressurizing the portion of the supply pipe 320 with respect to the supply support 333. The portion of the supply pipe 320 supported by the supply support 333 is formed of an elastic material. As the supply pipe 320 has elastic properties, the supply pipe 320 is repeatedly elastically deformed and elastically recovered every time it is pressurized sequentially by the rollers 332.

The wiping unit 400 wipes the nozzle 110 that is cleaned using the cleaning unit 300. The wiping unit 400 according to the present exemplary embodiment is disposed on the cleaning unit 300. The wiping unit 400 includes a pair of wiping members 410 and a pair of sliding members 420. The pair of wiping members 410 are disposed to face each other. The pair of wiping members 410 are each covered with a cleaning sheet 411. The cleaning sheet 411 may be formed of various materials such as non-woven fiber or cotton, with which the cleaning liquid L smeared on the nozzle 110 may be wiped. The sliding members 420 are configured to horizontally move the pair of wiping members 410 forward or backward in a direction that they approach or move away from each other. After the pump transporting unit 200 has disposed the nozzle 110 between the wiping members 410, the sliding members 420 move the wiping members 410 forward. While the pair of wiping members 410 are pressing down the nozzle 110, when the pump transporting unit 200 lifts up the nozzle 110, the cleaning liquid L or contaminants smeared on the nozzle 110 are wiped by the cleaning sheet 411. In the present exemplary embodiment, the pair of wiping members 410 of the wiping unit 400 are disposed to face each other, above the spouting unit 310 and with the spouting unit 310 included therebetween. After cleaning of the nozzle 110 is finished according to the above structure, the nozzle 110 is immediately lifted so that the cleaning liquid L is wiped by the wiping unit 400.

Hereinafter, a method of dispensing an adhesive liquid for a dust trap according to an exemplary embodiment of the present invention, by using the apparatus for dispensing an adhesive liquid for a dust trap of the present exemplary embodiment configured as described above will be described.

First, while transporting the adhesive liquid pump 100 by using the pump transporting unit 200, an adhesive liquid is dispensed to the camera modules 10 through the nozzle 110 of the adhesive liquid pump 100 in step (a). The adhesive liquid is dispensed sequentially to each of the camera modules 10 placed on the tray 20. The adhesive liquid is dispensed to an area around the image sensor 11 of the camera modules 10 by moving the nozzle 110 along preset patterns. The pump transporting unit 200 moves the nozzle 110 with respect to the camera module 10 along a preset path so that the adhesive liquid dispensed from the nozzle 110 is dispensed to the camera module 10. The pump transporting unit 200 transports the nozzle 110 sequentially to a next camera module 10.

The adhesive liquid L dispensed to the area around the image sensor 11 of the camera module 10 is quickly hardened. Due to a static electricity force generated by components contained in the adhesive liquid, dust existing around the image sensor 11 falls principally onto the adhesive liquid to be adhered thereto. According to this principle, dust is mainly adhered to the adhesive liquid, thereby lowering the possibility that the image sensor 11 of the camera module 10 is contaminated by dust.

While dispensing the adhesive liquid by using the adhesive liquid pump 100 as described above, a portion of the adhesive liquid may be smeared on an external surface of the nozzle 110 to be hardened or dust may be attached to the adhesive liquid smeared on the external surface of the nozzle 110. The adhesive liquid or the dust smeared on the external surface of the nozzle 110 may degrade dispensing performance of the adhesive liquid pump 100. In addition, surface tension of the adhesive liquid smeared on the external surface of the nozzle 110 may deform dispensing characteristics of the adhesive liquid pump 100.

In order to prevent contamination of the nozzle 110 as described above, the pump transporting unit 200 may transport the adhesive liquid pump 100 to the cleaning unit 300 so as to clean the nozzle 110 of the adhesive liquid pump 100 in step (b).

When the cleaning liquid pump 330 of the cleaning unit 300 supplies the cleaning liquid L to the spouting unit 310 through the supply pipe 320, a flow of the cleaning liquid L is generated in the spouting unit 310. According to the present exemplary embodiment, the cleaning liquid L is spouted upwards and then flows downwards through the spouting unit 310 which is configured to face upwards. When the pump transporting unit 200 lowers the adhesive liquid pump 100, the nozzle 110 draws near the spouting unit 310 so as to be immersed in the cleaning liquid L spouted from the spouting unit 310. A liquid that dissolves the adhesive liquid is used as the cleaning liquid L, and accordingly, the adhesive liquid smeared or hardened on the nozzle 110 is cleaned through the flow of the cleaning liquid L.

The cleaning liquid L that has cleaned the nozzle 110 in the spouting unit 310 flows downwards to be collected in the collecting unit 350. The cleaning liquid L stored in the collecting unit 350 flows to the supply pipe 320 through the circulation pipe 340. As the collecting unit 350 and the supply pipe 320 are connected to each other via the circulation pipe 340, the cleaning liquid L is circulated by the cleaning liquid pump 330 through the supply pipe 320 and the circulation pipe 340.

The cleaning liquid pump 330 is in the form of a peristaltic pump as described above. When the supply rotational axis 331 is rotated, the three rollers 332 roll along the supply pipe 320 while sequentially pressurizing and deforming the supply pipe 320 with respect to the supply support 333. The supply pipe 320 formed of an elastic material is elastically deformed and then elastically recovered by the rollers 332, thereby pumping the cleaning liquid L in the supply pipe 320 towards the spouting unit 310.

Pumps having diverse forms other than the peristaltic pump described above may also be used as the cleaning liquid pump 330. However, when the cleaning liquid pump 330 having the structure illustrated in FIG. 3 and described above is used, the cleaning liquid pump 330 may supply the cleaning liquid L to the spouting unit 310 in a manner that the cleaning liquid L has discrete velocities and fluxes. The fluctuating flow of the cleaning liquid L enhances the efficiency of cleaning the nozzle 110 in the spouting unit 310.

After completing cleaning of the nozzle 110, the nozzle 110 of the adhesive liquid pump 100 is wiped using the wiping unit 400 in step (c).

While performing steps (a) and (b) described above, the pair of wiping members 410 of the wiping unit 400 are at locations away from each other as illustrated in FIG. 1.

As the wiping unit 400 is disposed on the cleaning unit 300 as described above, in the apparatus for dispensing an adhesive liquid for a dust trap of the present exemplary embodiment, when cleaning of the nozzle 110 is completed, the nozzle 110 may be immediately lifted up so as to wipe the cleaning liquid L smeared on the nozzle 110 on the cleaning unit 300.

According to the method of dispensing an adhesive liquid for a dust trap of the present exemplary embodiment, the cleaning liquid L of the nozzle 110 is wiped through a process as below.

First, the adhesive liquid pump 100 is lifted using the pump transporting unit 200 so as to dispose the nozzle 110 between the pair of wiping members 410 in step (c-1).

Figure 4:
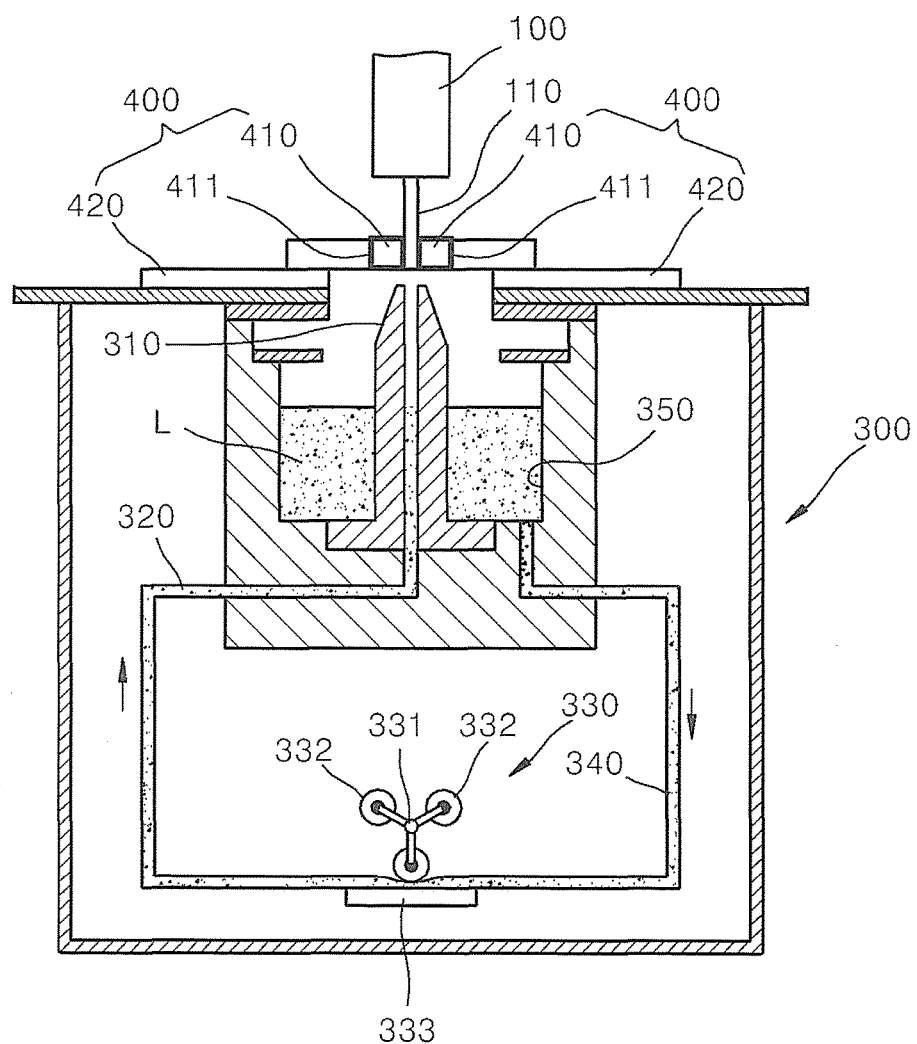
FIG. 4 is a view for describing an operation of the apparatus for dispensing an adhesive liquid for a dust trap illustrated in FIG. 3.

Then, as illustrated in FIG. 4, the sliding members 420 of the wiping unit 400 are operated so that the pair of wiping members 410 slide in a direction in which they approach each other in step (c-2). The cleaning sheet 411 covered on the wiping members 410 comes into contact with the nozzle 110 to pressurize the nozzle 110.

Then the pump transporting unit 200 is operated to lift up the nozzle 110 of the nozzle 110 in step (c-3). As a result, the cleaning liquid L smeared on the nozzle 110 is wiped by the cleaning sheet 411.

The pump transporting unit 200 transports the adhesive liquid pump 100 back to the tray 20 of the camera modules 10 so as to continue the operation of dispensing an adhesive liquid. The sliding members 420 respectively move the pair of wiping members 410 backward so that they are away from each other. As the wiping members 410 are transported to be away from each other, the nozzle 110 may be transported to the cleaning unit 300 to be cleaned again next time.

While the present invention has been described with reference to preferred embodiments, the scope of the present invention is not limited to the above described and illustrated structures.

For example, while the apparatus for dispensing an adhesive liquid for a dust trap of the above-described exemplary embodiment is described as including the wiping unit 400, an apparatus for dispensing an adhesive liquid for a dust trap, which does not include the wiping unit 400 may also be configured.

In addition, the structure of the wiping unit 400 may also be modified in various manners.

In addition, while the cleaning unit 300 is described as a circulation structure, a cleaning unit without the circulation pipe 340 may also be used. If the circulation pipe 340 is not included, a cleaning unit may be configured such that a cleaning liquid spouted through a spouting unit is discharged to the outside. In this case, the discharged cleaning liquid may be collected and supplied to the spouting unit 310 again. A cleaning liquid pump of the cleaning unit may also have various structures. The spouting unit of the cleaning unit may also have different structures from that of FIGS. 3 and 4 as long as a cleaning liquid may flow through the spouting unit.

According to the apparatus and method of dispensing an adhesive liquid for a dust trap of the present invention, the adhesive liquid may be dispensed to a camera module while effectively cleaning the adhesive liquid that may be smeared on a nozzle, thereby enhancing productivity and quality of a process of forming a dust trap.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:

1. A method of dispensing an adhesive liquid for a dust trap, to a portion around an image sensor of a camera module, to prevent dust contamination of the image sensor during a manufacturing process of the camera module, the method comprising:
   (a) transporting an adhesive liquid pump by using a pump transporting unit so as to dispense the adhesive liquid to the camera module through a nozzle of the adhesive liquid pump; and
   (b) transporting the adhesive liquid pump by using the pump transporting unit, to a cleaning unit that allows a cleaning liquid to flow so as to clean the nozzle of the adhesive liquid pump; and
   (c) wiping, by using a wiping unit, the nozzle of the adhesive liquid pump transported using the pump transporting unit, wherein the wiping unit comprises:
   a pair of wiping members facing each other and each covered with a cleaning sheet; and
   a sliding member for moving the pair of wiping members so that the wiping members approach each other in a horizontal direction,
   wherein the step (c) comprises:
   (c-1) disposing, by using the pump transporting unit, the nozzle of the adhesive liquid pump between the pair of wiping members;
   (c-2) transporting the pair of wiping members to approach each other by using the sliding member of the wiping unit, so as to bring the cleaning sheets into contact with the nozzle of the adhesive liquid pump; and
   (c-3) lifting the nozzle of the adhesive liquid pump by using the pump transporting unit while the cleaning sheets are in contact with the nozzle of the adhesive liquid pump.

2. The method of claim 1, wherein the step (b) comprises:
   transporting, by the pump transporting unit, the nozzle of the adhesive liquid pump to a spouting unit of the cleaning unit;
   spouting, by the spouting unit, the cleaning liquid such that the nozzle of the adhesive liquid pump transported using the pump transporting unit is immersed in the cleaning liquid; and
   supplying, by a cleaning liquid pump, the cleaning liquid to the spouting unit via a supply pipe; and
   connecting, by a supply pipe, the cleaning liquid pump and the spouting unit.

3. The method of claim 2, wherein the step (b) further comprises:
   collecting, by a collecting unit, the cleaning liquid supplied to the spouting unit by the cleaning liquid pump; and
   connecting, by a circulation pipe, the collecting unit and the supply pipe to circulate the cleaning liquid collected in the collecting unit to the spouting unit.

4. The method of claim 1, wherein after performing the step (b), the adhesive liquid pump is lifted using the pump transporting unit to perform the step (c) on the cleaning unit.

* * * * *